US009203350B2

(12) United States Patent
Dempsey et al.

(10) Patent No.: US 9,203,350 B2
(45) Date of Patent: Dec. 1, 2015

(54) TRANSCONDUCTANCE CIRCUIT AND A CURRENT DIGITAL TO ANALOG CONVERTER USING SUCH TRANSCONDUCTANCE CIRCUITS

(71) Applicant: ANALOG DEVICES TECHNOLOGY, Hamilton (BM)

(72) Inventors: Dennis A. Dempsey, Newport (IE); Sean Brennan, County Limerick (IE); Colin Lyden, Baltimore (IE); John Jude O'Donnell, Quin (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 50 days.

(21) Appl. No.: 14/185,701

(22) Filed: Feb. 20, 2014

(65) Prior Publication Data

US 2014/0340150 A1    Nov. 20, 2014

Related U.S. Application Data

(60) Provisional application No. 61/825,511, filed on May 20, 2013.

(51) Int. Cl.
*H03F 1/22* (2006.01)
*H03F 3/45* (2006.01)
*H03M 1/76* (2006.01)
*H03M 1/80* (2006.01)

(52) U.S. Cl.
CPC ............ *H03F 1/223* (2013.01); *H03F 3/45475* (2013.01); *H03F 2200/156* (2013.01); *H03F 2203/45116* (2013.01); *H03F 2203/45528* (2013.01); *H03F 2203/45536* (2013.01); *H03F 2203/45696* (2013.01); *H03M 1/765* (2013.01); *H03M 1/808* (2013.01)

(58) Field of Classification Search
CPC ................ H03G 3/30; H03F 2200/123; H03F 2200/156
USPC ................................... 330/86, 254, 282, 283
See application file for complete search history.

(56) References Cited

U.S. PATENT DOCUMENTS

| 4,013,975 | A | * | 3/1977 | Kataoka et al. | 330/145 |
| 5,392,003 | A | * | 2/1995 | Nag et al. | 330/254 |

(Continued)

OTHER PUBLICATIONS

Walt Kester, "Basic DAC Architectures II: Binary DACs", Analog Devices, MT-015 Tutorial, Rev. A, Oct. 2008, WK © 2009, 10 pages, http://www.analog.com/static/importd-files/tutorials/MT-105.pdf.

(Continued)

*Primary Examiner* — Steven J Mottola
(74) *Attorney, Agent, or Firm* — Patent Capital Group (57) ABSTRACT

An example transconductance circuit is provided in accordance with one embodiment. The transconductance circuit can comprise: an output node; at least one transistor; a variable resistance; and a differential amplifier; wherein the at least one transistor and the variable resistance are in series connection with the output node, an output of the differential amplifier is connected to a control node of the at least one transistor, a first input of the amplifier is responsive to an input signal, and a second input of the amplifier is responsive to a voltage across the variable resistance. Such a circuit may overcome noise problems in transconductance circuits which operate over a wide range of input signals with a fixed resistor in series with the at least one transistor.

33 Claims, 6 Drawing Sheets

(56) References Cited

U.S. PATENT DOCUMENTS

| | | | |
|---|---|---|---|
| 5,495,245 | A | 2/1996 | Ashe |
| 6,064,264 | A * | 5/2000 | Tarsia et al. .................. 330/277 |
| 6,414,616 | B1 | 7/2002 | Dempsey |
| 6,567,026 | B1 | 5/2003 | Gorman |
| 7,956,786 | B2 | 6/2011 | Cosgrave |
| 2012/0206284 | A1 | 8/2012 | Gradinariu |

OTHER PUBLICATIONS

Eric A. Vittoz, "The Design of High-Performance Analog Circuits on Digital CMOS Chips", IEEE Journal of Solid-State Circuits, vol. SC-20, No. 3, Jun. 1985, 0018-92—/85/0600-0657 © 1985 IEEE, pp. 657-665.

Torsten Lehmann et al., "1-V Power Supply CMOS Cascode Amplifier", IEEE Journal of Solid-State Circuits, vol. 36, No. 7, Jul. 2001, 0018-9200/01 © 2001 IEEE, pp. 1082-1086.

Hwang-Cherng Chow et al., "1V 10-bit Successive Approximation ADC for Low Power Biomedical Applications", 1-4244-1342-7/07 © 2007 IEEE, pp. 196-199.

* cited by examiner

TRANSCONDUCTANCE CIRCUIT AND A CURRENT DIGITAL TO ANALOG CONVERTER USING SUCH TRANSCONDUCTANCE CIRCUITS

PRIORITY DATA

This application is a non-provisional of U.S. Provisional Patent Application Ser. No. 61/825,511, filed May 20, 2013, which is hereby incorporated by reference in its entirety.

TECHNICAL FIELD

This disclosure relates generally to an improved transconductance circuit and, further, to other circuits, systems, architectures, and devices such as digital to analog converters employing such circuits.

BACKGROUND

Transconductance is a property of certain electrical components. Transconductance components can provide an electrical current output based on a voltage input. For example, if the input voltage increases then the output current may similarly increase. The ability to output an analog signal as a current can have advantages such as providing a signal over longer wire or transmission distances than is possible with a voltage signal, and also has utility in many electronic circuits. Furthermore, current mode signals can be insensitive to voltage drops or voltage differences, which provide a robustness that is desirable in many systems.

In general, transconductance devices suffer from several problems that include performance issues over an operating range. In certain systems, when an input voltage was low, noise resulting from an amplifier in the transconductance circuit would be the dominant noise source. Other amplifier related contributions may also become more significant with low input voltages, such contributions may include offsets from the amplifier. Transconductance devices or circuits may also be known as voltage to current converters.

BRIEF DESCRIPTION OF THE DRAWINGS

Embodiments of an improved transconductance devices and digital to analog converters using such transconductance devices will now be described, by way of non-limiting examples, with reference to the accompanying drawings, in which.

DETAILED DESCRIPTION OF EXAMPLE EMBODIMENTS

Overview

According to a first aspect of this disclosure, there is provided a transconductance circuit comprising: an output node; at least one transistor; a variable resistance; and a differential amplifier. The at least one transistor and the variable resistance are in series connection with the output node. An output of the differential amplifier is connected to a control node of the at least one transistor. A first input of the amplifier is responsive to an input signal, and a second input of the amplifier is responsive to a voltage across the variable resistance. Advantageously all of the components of the transconductance circuit are provided within an integrated circuit package, and preferably on a common semiconductor substrate.

The transistor may be, for example, a field effect transistor such as a metal oxide field effect transistor (MOSFET), a junction field effect transistor, multiple gate devices such as trigate FETs, FINFETs and so on. The transistor may also be a bipolar junction transistor, an insulated gate bipolar transistor (IGBT) or any other type of transistor. In an embodiment of the disclosure, MOSFETs are chosen because of the low gate current exhibited by such devices. The amplifier may be implemented as any suitable differential amplifier and is not so limited to the specific implementations discussed herein.

The variable resistance may be implemented as passive devices, active devices, an architecture to provide a dynamic or tunable resistance, or as other types of dynamically tunable resistance devices. Passive devices may include (without this list being definitive) laser trimmed resistors, film resistors, thin film resistors, polysilicon resistors, diffused resistors or carbon based resistances. Active resistive devices may include electrically tuned resistors such as polysilicon or thin film resistors where selective heating of the resistor may be used to vary its resistance. Active resistors may also include temperature coefficient tuned impedances (such devices being commercially available as iTRIM), active tuned impedances such as MOS using VGN for example as shown in U.S. Pat. No. 5,764,174. Resistive architectures may also include a digital potentiometer and resistive digital to analog converters. Furthermore, a digital potentiometers informally often known as a "digipot" (Trademark used by Analog Devices Inc.) or as an RDAC is a digitally controlled electronic component that mimics the analog function of a potentiometer, and which may also be used as the variable resistance. Such "digipots" are often used for trimming and scaling analog signals by microcontrollers. A "digipot" may be built using a ladder DAC, such as an R-2R resistive configuration. The resistive string construction is the most common form of electrically controllable resistance available at the time of writing. Each step on the resistor ladder may have its own switch that can connect this step to the output of the digipot. The selected step on the ladder determines the resistance ratio of the digital potentiometer. In certain embodiments, the resistor can be implemented with a MOS device, whose resistance can depend on the control signals supplied to the MOS device. Thus, any suitable resistor technology (or means of synthesizing a resistance) may be used. The variable resistor may be provided as part of an integrated circuit, and may be calibrated and/or trimmed during manufacture or in user controlled trimming steps.

The variable resistor may comprise a switchable array of resistors. The array of resistors may comprise a plurality of resistors, which are individually and selectively connectable between a first resistor node and a second resistor node. The first resistor node may form an input to the amplifier. Thus, the first resistor node may be connected to the inverting input of the differential amplifier. The second resistor node may be connected to a reference potential, such as a supply rail. Alternatively, a measurement amplifier may be provided to measure the voltage across the at least one resistor, and to provide this measured voltage difference as an input to the differential amplifier. The variable resistor may be provided as a plurality of resistors as part of a monolithic integrated circuit. In some embodiments, the variable resistance may be synthesized, for example by switched mode capacitor techniques.

The individually connectable resistors may be associated with respective switches in order to connect or disconnect a particular resistor from between the first and second resistor nodes. The switches may be implemented as transistor switches or as mechanical switches, for example micro-electromechanical systems (MEMS) switches or relays.

The at least one transistor may be provided as an array of transistors fabricated within an integrated circuit. The transistors may be associated with respective resistors. The resistors and transistors may be scaled such that if a resistance of one resistor (an N+1th resistor) is half that of another resistor (an Nth resistor) such that for the same voltage across the resistors twice as much current flows in the N+1th resistor compared to the Nth resistor, then the associated transistor may be scaled such that a transistor current density, for example a channel current density, remains substantially the same between devices. Thus if an Nth transistor is associated with the Nth resistor and a N+1th transistor is associated with the N+1th resistor then the width to length ratio of the N+1th transistor may be selected to be substantially twice that of the Nth transistor. Size ratios other than 2:1 may be selected. Thus radix such as 1.8 or 1.9 may be used to ensure "no missing codes" in the current range and/or additional low current (such as additional least significant bit) current sources may be provided such that, in use, the current provided by the transistors may be set slightly on the low side and augmented by the additional current sources to bring it up to a desired value. The scaling of transistors may be performed by providing "unit" sized devices in parallel. The scaling of resistors may be provided by providing "unit" sized devices in series. It should be noted that using a reduced radix could be extended to other number systems. Thus where segmented architectures are used, the scaling between the elements and between segments may be selected to ensure no missing codes.

Alternatively, or in addition to providing redundancy by way of additional current sources and/or scaling between resistors in the plurality of resistors, some or all of the transistors may be controlled by way of a connection to their back-gate to vary or trim the response of a transistor. Such trimming may be used to reduce or substantially cancel the effect of device mismatch between transistors and resistors in an array of such devices.

Additionally or alternatively small adjustments of the back-gate voltage may be made to the transistors in the transconductance DAC formed using a transconductance circuit to provide a further degree of open loop control in addition to (or indeed around) the closed loop response.

The voltage used to trim the back gate voltages may be provided by one or more digital to analog converters. In some embodiments, the back gate may be driven by a current source. This approach forward biases a base-emitter diode of a parasitic bipolar junction transistor, which exists in parallel with a FET and is formed by the drain, source, and back gate regions of the device. The forward biased diode converts a small current into a bias voltage in accordance with the I-V characteristic of the diode. The back-gate current can be provided by a transconductance circuit. The back-gate voltages of the transistors may thus be set to respective and different voltages to trim out variations between transistors in an array of transistors.

According to a second aspect of this disclosure, there is provided a digital to analog converter comprising at least one transconductance circuit constituting an embodiment of the first aspect of this disclosure. According to a third aspect of this disclosure there is provided an integrated circuit transconductance circuit in which an electrically controllable variable resistance is provided within a control loop of a digital code to analog current convertor.

In a further aspect there is provided an integrated circuit comprising a plurality of current control stages, wherein at least some of the stages comprise a field effect transistor arranged to pass a current in response to a shared voltage provided to gates of the field effect transistors, and wherein a plurality of the transistors have back gates which are connected to a circuit that is adapted to supply respective voltages or currents to the back gates of the transistors such that different transistors may have different back gate voltages.

It is this possible to trim the currents passed by the transistors to modify the response of one or more of the transistors such that the circuit exhibits a desired response characteristic or more nearly approximates the desired characteristic.

A precision transconductance device as disclosed in some embodiments herein may overcome many of the problems of former devices and, potentially, allow for the output of relatively low noise current signals in response to low voltage signals at a device input and/or provide improved linearity when dealing with small input voltages. In some embodiments, the transconductance device is in the form of a digital to analog convertor, which receives an input digital code and outputs a current. Devices of the types disclosed herein can be used in industrial, healthcare, audio, and video application spaces, to name just a few applications of such a device. Precision and reduced noise devices can allow for more robust monitoring in medical systems, better audio/video systems, and improved performance in instrumentation and control systems.

There is further provided a method of trimming current between a plurality of current control stages, where first and second stages each comprise a respective field effect transistor, said field effect transistors having top gates and back gates, wherein the top gates are connected to a shared node so as to receive a shared control voltage, and the back gates are driven to respective voltages so as to set a current ratio between the first and second stages to a desired value.

Example Embodiments and Example Implementations

Figures 1, 2, 3:
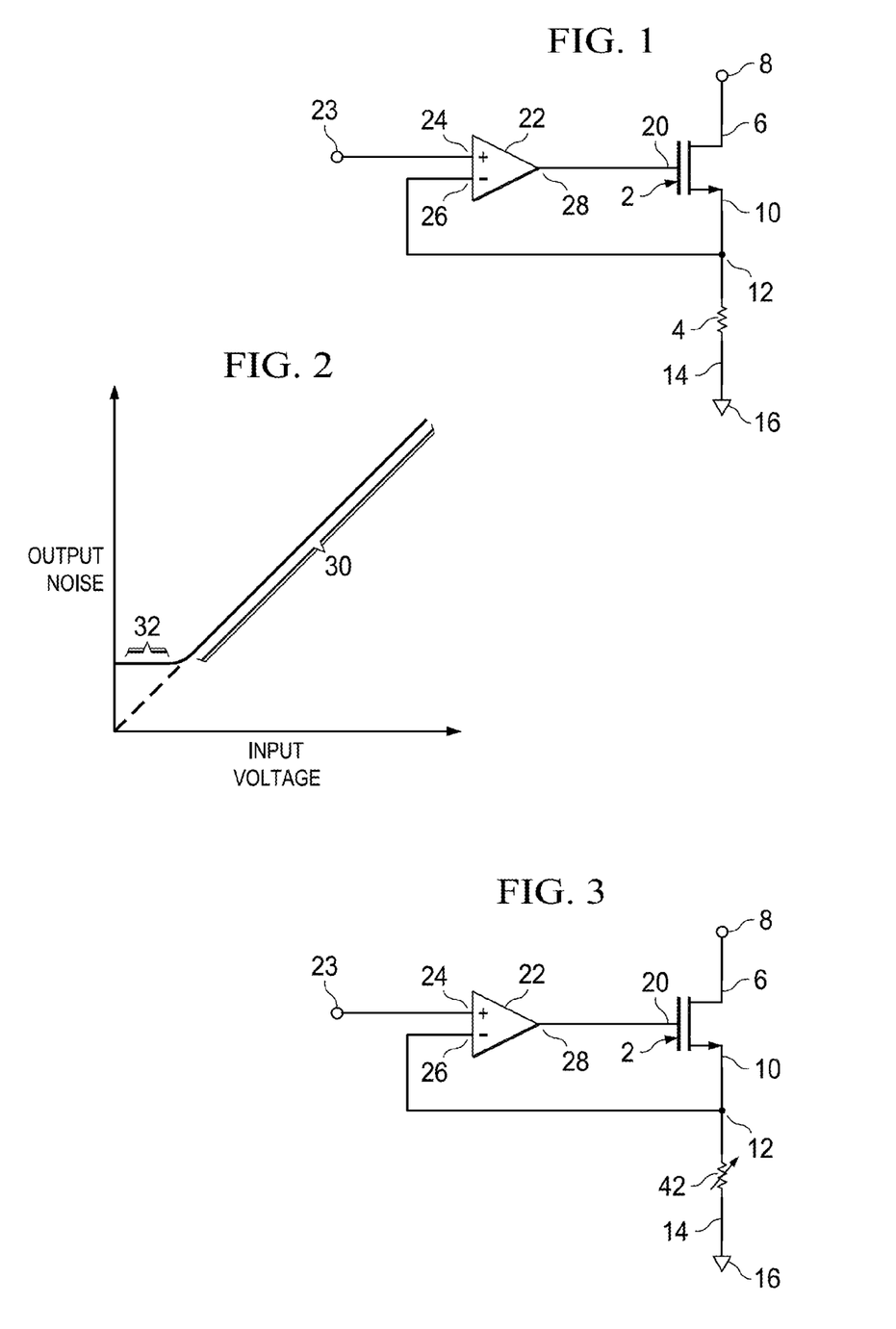
FIG. 1 is an example embodiment circuit diagram of a transconductance circuit for converting an input voltage to an output current.
FIG. 2 is an example embodiment graph showing output noise power versus input voltage for the transconductance circuit of FIG. 1.
FIG. 3 is an example embodiment circuit diagram of a transconductance circuit in accordance with the present disclosure.

FIG. 1 is a circuit diagram of an example transconductance stage. The circuit comprises a transistor 2 in series connection with a resistor 4. In this particular example the transistor 2 is an N channel MOSFET, having its drain 6 connected to an output node 8, and its source 10 connected to a first terminal of the resistor 4 at a first resistor node 12. A second terminal of the resistor 4 is connected at a second resistor node 16 to a reference voltage such as ground or $V_{SS}$. A gate 20 of the transistor 2 functions as a control terminal for the circuit. In a basic example, an input voltage could be directly supplied to the gate 20, and to a first approximation, the output current at the node 8 would be substantially proportional to the voltage at the gate 20. However, in slightly more sophisticated implementations a differential amplifier 22 is provided. The amplifier 22 is configured such that the input signal Vin from an input node 23 is provided to a non-inverting input 24 of the amplifier 22. A voltage at the first resistor node 12, which effectively represents the voltage across the resistor and consequently the current flowing through the resistor 4 is connected to an inverting input 26 of the amplifier 22, and an output 28 of the amplifier 22 is connected to the gate 20 of the transistor 2. Thus, the action of the differential amplifier 22 is to form a negative feedback loop to linearize the operation of the circuit shown in FIG. 1 by desensitizing the overall response of the circuit to non-linearities in the response of the transistor 2. This desensitizing is achieved by a combination of high amplifier gain and the negative feedback.

Although this circuit works well, it is not without its own performance problems. For example, if the input voltage to the amplifier is low (close to ground), then noise on the input of the amplifier (noise generated by the amplifier which is often referred to as "input referred noise") will be relatively large compared to the input voltage and will be amplified in the output of the amplifier. Similarly, other types of noise, for example thermal noise across the resistor 4, will also be amplified. At high input voltages, which result in a high output current, the noise contribution from the amplifier is small in comparison to the output current, and probably to noise therein, and it does not pose a significant problem. However, as the input voltage and hence the current becomes smaller, then the noise contribution from the amplifier become more significant. Similarly, the proportional effect of input voltage offsets at the amplifier becomes much more significant as the magnitude of the Vin decreases relative to the amplifier input offset voltage. In addition, the magnitude of the input offset voltage may vary with the input voltage. Similarly other effects such as voltage changes due to the non-zero impedance of the circuit which supplies the input voltage Vin (not shown), and variations in the reference voltage at the second resistor node 16 due to signal currents in the supply rail, cross talk and thermally induced component variations may all become more significant when the input voltage is small.

FIG. 2 schematically illustrates the noise performance of the circuit of FIG. 1. The input voltage is assumed to be variable and is plotted along the abscissa (X-axis) of the graph whereas the output current noise power component is plotted along the ordinate (Y-axis) of the graph. For relatively high input voltages, the relationship between the input voltage and the output noise is substantially linear, as represented by region 30 of FIG. 2. The reciprocal of the gradient of the line in region 30 represents the signal to noise ratio of the transconductance circuit. However, it becomes apparent that the amplifier is itself a source of noise. Similarly, the resistor 4 is a source of thermal noise. These noise sources set a lower noise value, as indicated by the region 32 in FIG. 2. The thermal noise from the resistor 4 is subject to the gain of the amplifier 22.

The amplifier contribution to the noise can be, in part, addressed by using a chopped amplifier (also known as a chopping amplifier), such that the noise performance of the amplifier can move to a predetermined portion of the output spectrum of the transconductance circuit. However, the noise contribution from the resistor is fundamental.

Low input signal values also reveal other non-ideal artifacts of the differential amplifier, such as input offset voltages that give rise to a non-linearity in the V-I response of the transconductance circuit at lower input voltages. Techniques, such as auto-zeroing can be adopted to reduce the impact of offsets.

However, there is more opportunity to deal with the noise performance of the circuit [and also the offset performance], if the value of the resistor 4 could be varied. This would enable some adjustment between input voltage at the input node, and the resistor value to be achieved, with a view to improving performance.

FIG. 3 schematically illustrates a first embodiment of a transconductance circuit constructed in accordance with the teachings of this document. The arrangement in FIG. 3 is similar to that shown in FIG. 1, and identical reference numerals have been used to designate similar parts. The significant difference is that the fixed value resistor 4 of FIG. 1 has now been replaced by a variable resistor 42 of FIG. 3. The variable resistor 42 is still in series connection with the source 10 of the transistor 2 and the reference voltage 16.

The resistor 42 may be implemented as a digitally controlled device, for example as an array of resistors, which can be selectively switched into various configurations with one another to change the impedance between the first and second resistor nodes 12 and 14.

Figure 4:
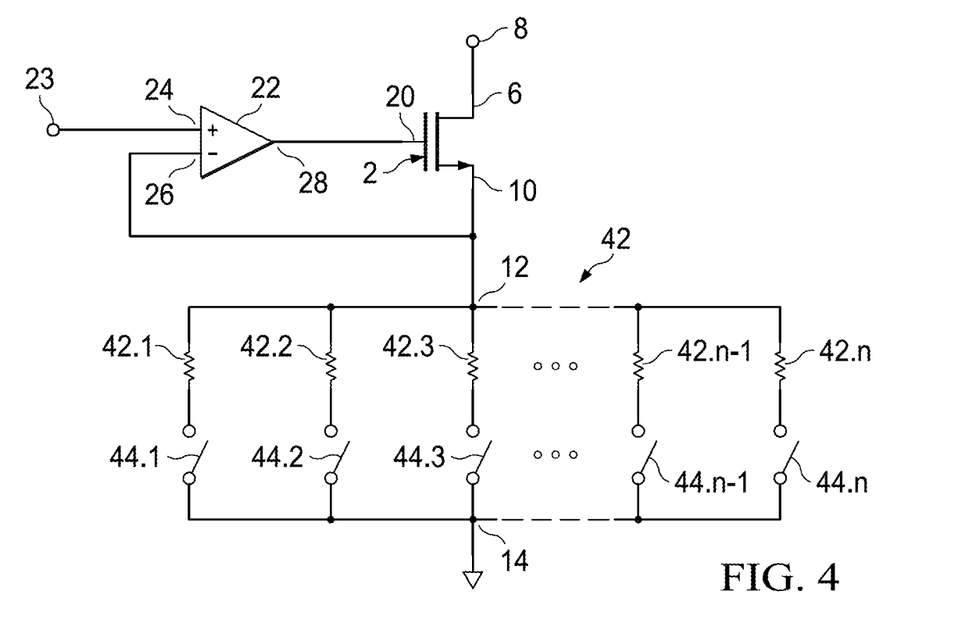
FIG. 4 shows an example embodiment variation on the circuit of FIG. 3.

FIG. 4 is a circuit diagram showing an embodiment of a transconductance stage in which the variable resistor 42 of FIG. 3 is implemented by an array of parallel resistors 42.1 to 42.n in series with switches 44.1 to 44.n. Each resistor is associated with a respective series connected switch, and all of the resistors can be selectively placed in current flow communication between the resistor nodes 12 and 14. The switches 44.1 to 44.n may be implemented as transistors or mechanical switches, including MEMS switches and relays. The resistors 42.1 to 42.n may be weighted so as to form a binary weighted array, or a non-binary weighted array (radix less than two), or they may be of notionally the same value (unary array) so as to form a thermometer encoded array, or grouped into decades, or a mixture of these schemes. It should be noted that a binary weighted (or indeed any) array may include repeated (additional) bits/resistors for providing redundancy. Thus the current at the output node is a function of the input voltage at the non-inverting input 24 of the amplifier 22 and whichever one or ones of the resistors 42.1 to 42.n have been selected. The choice of scaling may be made by the designer in accordance with their specific requirements for the input to output characteristic of the transconductance stage.

Where the switches 44.1 to 44.n are provided as transistors, it is advantageous to scale the transistors (e.g. the channel width to length ratio of a FET) in proportion to the relative currents that each transistor is expected to pass compared to the other transistors in the array such that the current density remains substantially constant across all devices, and hence the voltage drops across each switch when it is in a conducting state are substantially matched.

The provision of a variable resistor 42 means that there is now an opportunity to trade off resistor noise against amplifier noise.

Thermal noise from a resistor is given by $$Vn = (4k_\beta TR\Delta F)^{1/2}$$

where Vn=RMS noise voltage
$k_\beta$=Boltzmann's constant
T=Temperature in Kelvin
R=Resistance of the resistor
$\Delta F$=Noise bandwidth Thus as the resistance R of the resistor 42 is increased, then the noise from the resistor increases. However, a significant and probably the dominant source of thermal noise is likely to be the amplifier 22, with most of the noise power being attributable to the first stage of the amplifier 42. At low current values, the resistor noise can be traded against supplying a larger signal to the amplifier 22, and hence in influence of amplifier noise can be proportionally reduced.

In the arrangements shown in FIGS. 3 and 4, the change in the resistance values occurs outside of the feedback path between the source 10 of the transistor 2 and the inverting input 26 of the differential amplifier 22. Thus, there are no switching actions within the feedback path, and in particular, the circuit cannot inadvertently break the feedback path.

The variable resistance 42 may be formed of a resistor ladder network or a combination of an resistor ladder and the parallel current paths shown in FIG. 4. Such combinations of configurations may be chosen by the designer to balance resistance-matching requirements against space (and hence cost) on an integrated circuit die.

The dynamic range of the input signal to the amplifier can be reduced if the resistor 42 becomes variable. In the limit, the input signal may become a fixed voltage and all of the DAC adjustment can be made by varying the resistance of resistor 42. This approach means that the bandwidth at the non-inverting input 24 can be significantly reduced, and hence the noise power supplied from a reference voltage generating circuit can be reduced. Thus, the architecture gives the designer the choice about whether to have a variable or fixed input voltage to the non-inverting input of the amplifier.

Figure 5:
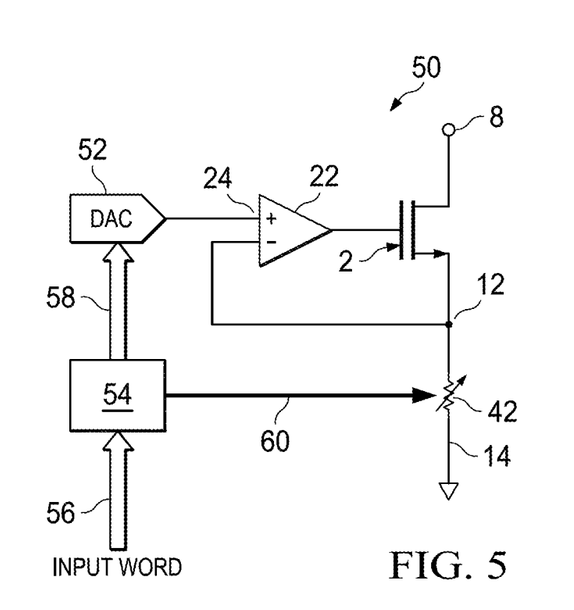
FIG. 5 shows an example embodiment of a digital to analog converter employing a controllable transconductance circuit.

FIG. 5 schematically illustrates an embodiment of a digital to analog converter having a variable transconductance stage. The transconductance stage, of the type illustrated in FIG. 3 or 4 is schematically designated as item 50. An input voltage to the non-inverting input 24 of the amplifier 22 may be provided by a variable voltage reference, such as digital to analog converter 52. The digital to analog converter 52 may be any suitable implementing technology such as an R-2R converter. The digital to analog converter 52 is responsive to a control word 58 supplied to it by a controller 54. The controller 54 acts to receive an input word 56, which represents the output current that it is desired to pass through the transconductance stage 50, and it may remap the input word 56 into the control word 58 to be sent to the digital to analog converter 52 and to a second control word 60 to be sent to the variable resistor 42. Thus, by controlling both the input voltage at the non-inverting input 24 of the amplifier 22 and the value of the variable resistance 42, the output current can be controlled in such a way as to achieve improved noise performance because the value of the resistance 42 can be selected, in conjunction with the noise performance of the amplifier 22 and the DAC 52 in order to seek an appropriate noise performance for any given input word.

The appropriate noise performance may not necessarily be a minimum noise for the circuit, as it may need to be balanced against other parameters of the circuit. Such parameters may include seeking to operate the amplifier over a range where its input stage exhibits a minimum offset voltage. It is at the discretion of the designer whether the input DAC 52 has an output voltage which spans a large range, or whether its voltage is centered around a relatively small range, such that in effect the DAC 52 provides the least significant bit performance whereas the controllable resistor 42 may provide the equivalent of the most significant bit performance of the digital to analog converter shown in FIG. 5. In the limit, all of the step wise control of the current when outputting an analog current representing a digital input word can be provided by controlling the value of the variable resistance 42, in which case the controller 54 does not necessarily need to remap the input word 56, although it may continue to do so where the transconductance stage 50 comprises a mixture of thermometer encoded and binary weighted resistors. In such an arrangement, the DAC 52 may be replaced by a fixed voltage reference.

Figure 6:
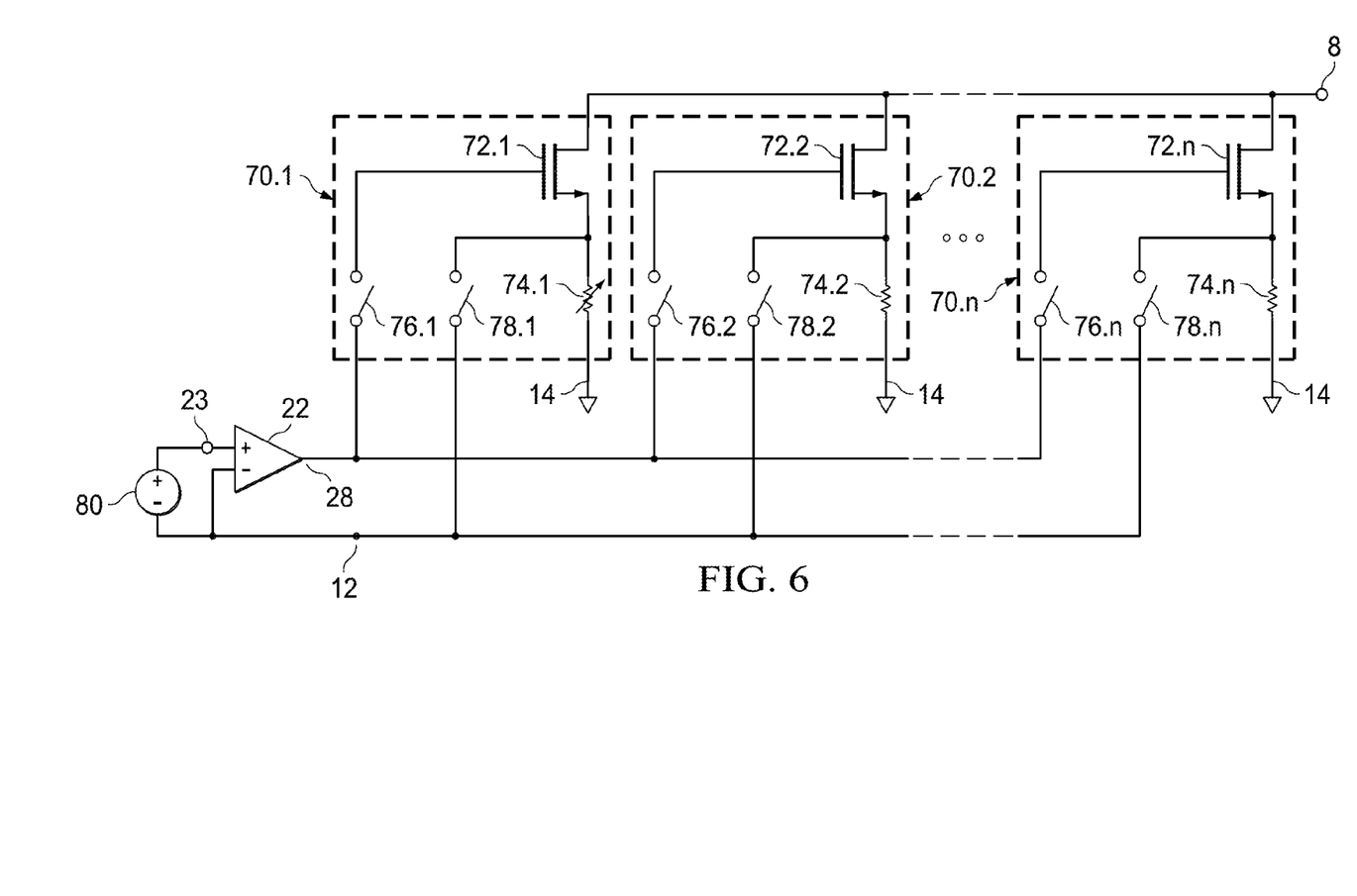
FIG. 6 shows an example embodiment of a transconductance circuit operable as a digital to analog converter.

FIG. 6 schematically illustrates a variation of an implementation of the circuit shown in FIG. 3 and FIG. 4. Within FIGS. 3 and 4, the series combination of the transistor 2 and the resistor 42 may be regarded as a single output stage connected to the differential amplifier 22. FIG. 6 takes this concept to the next stage, and has a plurality of output stages 70.1, 70.2, and so on up to 70.n, where the stages are effectively provided in parallel and each of the stages 70.1 to 70.n can be connected to the amplifier 22 such that each stage receives the signal from the output 28 of the amplifier 22 and that the voltage across each resistor within each stage is provided to the feedback circuit formed by the amplifier 22. The first stage 70.1 comprises a first transistor, which in this example is a field effect transistor 72.1 which acts as an output transistor for the first stage, and which is in series with a first stage resistor 74.1. A gate signal switch 76.1 is provided to selectively connect the gate of the transistor 72.1 to the output 28 of the amplifier 22. Similarly, a feedback switch 78.1 is provided to selectively connect a first node of the resistor 74.1 to the first resistor node 12, which is connected to the inverting input of the amplifier 22. Similar configurations are provided in each of the other output stages 70.2 to 70.n. The resistors 74.1, 74.2 to 74.n may be variable resistors or, as shown, they may be fixed value resistors. Alternatively, some stages may have variable resistors whereas other stages may have fixed value resistors. Furthermore, although each stage is shown as comprising only a single transistor and a single resistor, multiple transistors and resistors may be provided within a single stage in order to reduce the potential scaling problems between one stage and its neighbors. Thus, multiple transistor "units" and resistor "units" may be connected in parallel or series, as appropriate, to synthesize a correctly sized transistor and a correct resistance for any of the stages 70.1 to 70.n. This technique need not be described further as it is common in this field.

The stages 70.1 to 70.n may be weighted with respect to each other in various ways. For example, several of the stages may be thermometer encoded such that each stage has the same current output value as its neighbors. Thus, in an embodiment having twenty or more stages, stages 70.1 to 70.10 may be arranged to output a current having a notional value of "1." Stages 70.11 to 70.20 may each be arranged to output a current having a value of "10." Other ones of the stages (where they are provided) may be arranged to output binary weighted currents. The relative weighting between one stage and the next is a choice of the circuit designer, as is the number of stages. Thus, in this example where the first ten stages have the same notional current, then in order to provide an output current of "1" any single stage 70.1 to 70.10 may be energized by closing its switches 76 and 78. For a current of "2," any two of the stages 70.1 to 70.10 may be energized and so on. It may be beneficial to randomize or pseudo randomize which stages are selected in order to smooth out any differential non-linearity or integral non-linearity errors from the DAC shown in FIG. 6. This randomization may be done by the controller 54 (as shown in FIG. 5) that controls the operation of the switches 76.1 to 76.n and 78.1 to 78.n. Such randomization may be static or dynamic and, further, may be based on particular architecture or device needs. It should be noted that as each stage is selected it forms part of the feedback network such that the amplifier 22 performs voltage control to the gate of every single one of the transistors involved in supplying the output current. Thus, all the selected resistors 74.1 to 74.n are connected at one end to the inverting input of the amplifier 22, and at their other end to ground 14 or to Vss. In this embodiment switching of stages also causes a reconfiguration of the feedback network by virtue of switches 78.1 to 78.n being placed between the inverting input of the amplifier 22 and the sources of each transistor. It may be beneficial to include means to ensure that the switches are operated in such a sequence by the controller 54 (FIG. 5) that prevents the amplifier 22 from being placed in an open loop configuration. As a further alternative an impedance may be placed between the node 12 and the inverting input of the amplifier 22 or a capacitor connected to the inverting input of the amplifier 22 such that the bandwidth at the inverting input is reduced so that very short breaks in the feedback loop can be tolerated and/or that the switches are fast and operated so as to minimize disturbance to the feedback loop. The input node 23 may be provided with a constant voltage from a voltage reference, such as a precision voltage reference 80, or it may receive a variable reference voltage in response to a DAC 52 and controller 54 as described with reference to FIG. 5.

In the circuit of FIG. 6, the current output by the DAC may be influenced by the voltage at the output node as this affects the voltage occurring across each of the transistors in the output stage.

Figure 7:
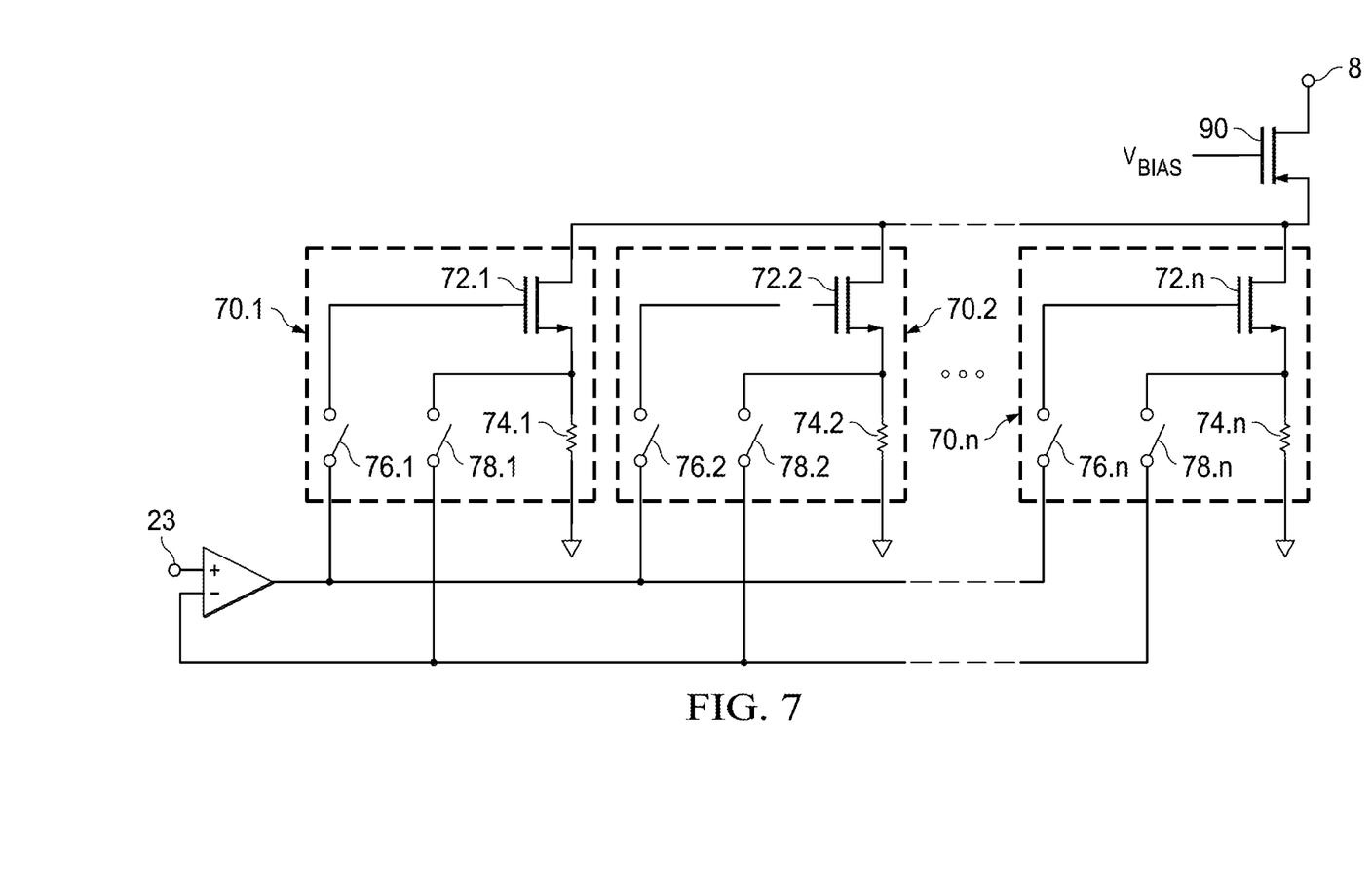
FIG. 7 shows an example embodiment variation on the circuit of FIG. 6 with the inclusion of a cascode transistor.

FIG. 7 shows a variation to the circuit of FIG. 6 where a further transistor has been provided between the various output stages 70.1 to 70.n and the output node 8 to substantially eliminate voltage variation across the transistors 72.1 to 72.n. Thus, the additional transistor 90 acts as a cascode transistor. In the arrangement shown in FIG. 7 a single cascode transistor has been provided for the entire device, although it should be noted that individual cascode transistors could equally be provided within each of the output stages 70.1 to 70.n. Other cascoding technologies or implementations may be used, such as telescopic or gain boosted cascode.

In use, the voltage applied to the non-inverting input of the amplifier 22 may be provided by a variable voltage source (such as a DAC 22) or it may be provided from a fixed voltage source.

The switches 76.1 to 76.n and 78.1 to 78.n, may be controlled from a digital word to switch one or more of the stages 70.1 to 70.n into the circuit. Each selected stage is in parallel with each other selected stage, is connected to the amplifier output, and is connected to the inverting input of the amplifier (which is the first resistor node).

Thus, the first end of each resistor 74.1 to 74.n in a selected stage is connected to the first end of each resistor in each other selected stage, by way of the switches 78. As a result, the voltage occurring at the inverting input of the amplifier is an average of the voltage at each source of the selected transistors, and is related to the current by the relative contribution of each transistor 72.1 to 72.n that has been selected.

Such an approach enables the amplifier 22 to be optimized for operation over a narrow input range, and makes it easier to fabricate a circuit for use with low voltage headroom in the power supply.

The use of a shared feedback loop further causes the noise from each resistor 74.1 to 74.n to be averaged with that of the other, so noise performance improves with increased current.

Where a cascode device 90 (or devices 90.1 to 90.n are provided where cascode devices are provided within each stage) the cascode device or devices should be implemented with a bias voltage that does not significantly impact on the voltage range that can be applied across each output stage. If individual cascode devices are provided for each stage then these may be switched between on and off states by the controller 54, and the gate of each transistor 72.1 to 72.n may remain connected to the amplifier output at all times.

The feedback switches 78.1 to 78.n may advantageously have their own resistance $R_{on}$ scaled to scale with the current flow in each output stage. This, if a stage (for example stage 70.11) passes 10I, where I is an arbitrary unit current, the value $R_{on}$ of the feedback resistor should be R/10, compared to the gain stage (such as stage 70.1) which passes a current I. This weighted average provides further accuracy in the feedback loop performance compared to not scaling the resistors. This weighing reduces the impact of resistor mismatch. The feedback switches may be implemented as field effect transistors. In general, a low feedback switch impedance is desirable as it also reduces the impact of resistor mismatch.

Advantageously each stage may have its own cascode transistor, with the width to length ratio of each cascode transistor being scaled with respect to current passed by its associated output stage. Thus, the voltage dropped across each cascode transistor is substantially constant.

FETs are four terminal devices, and within an integrated circuit, it is easy to fabricate a FET such that its back gate is accessible, and such that the back gate can be driven to a desired voltage. Introducing slight variations in the back gate voltage of individual ones of the transistors provides a way of varying the amount of current passed by a transistor for a given voltage at its gate terminal. In effect applying a voltage to the back gate with differs from that of the gate is a way of modifying the drain current versus $V_{gs}$ response to the transistor.

Figure 8:
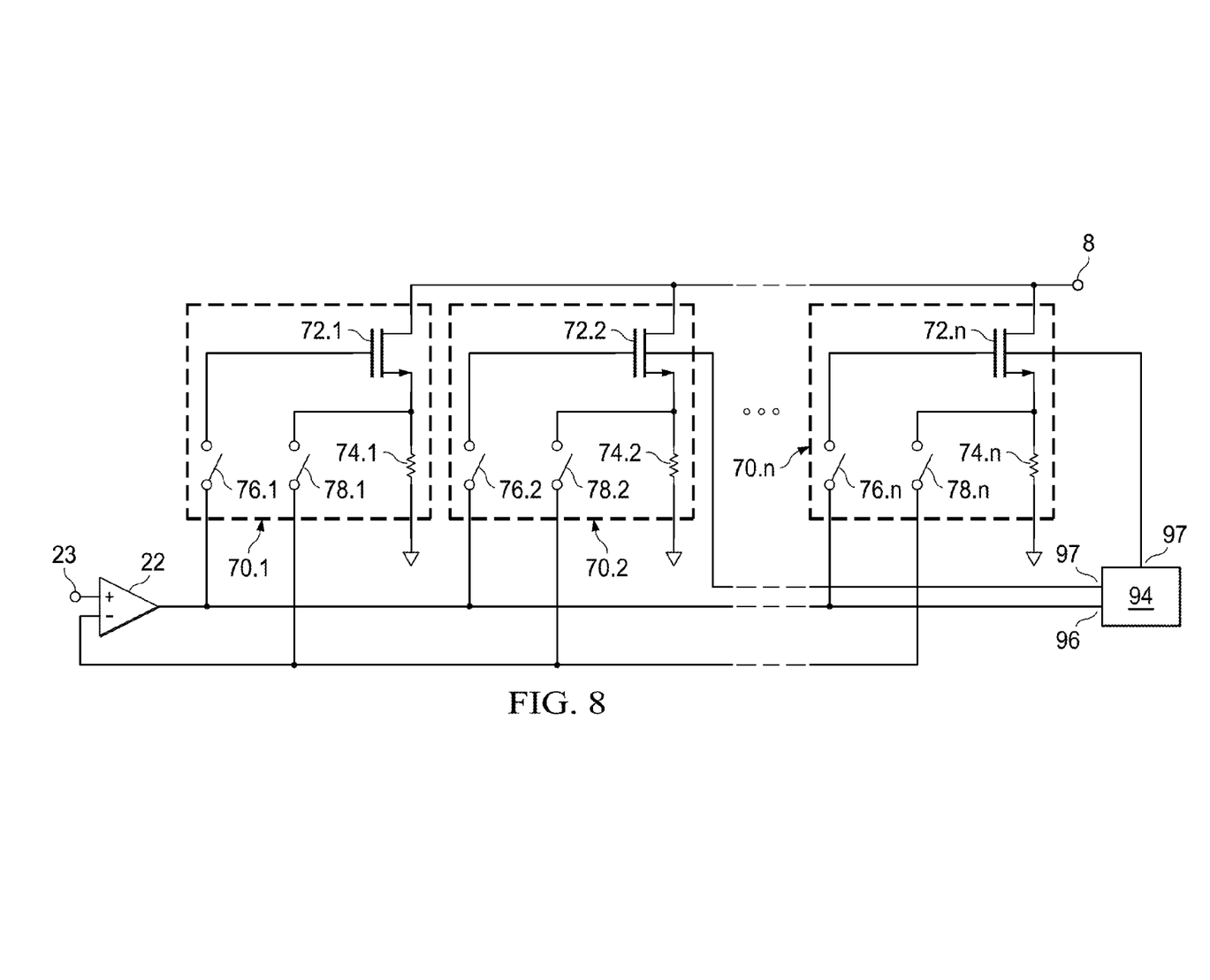
FIG. 8 shows an example embodiment of a transconductance stage is which a correction circuit is provided to modify a back gate voltage of at least one output transistor.

In a further embodiment shown in FIG. 8 a correction circuit 94 is provided to vary a back gate voltage of one or more of the output transistors 72.1 to 72.n. The correction circuit 94 may have an input 96 for receiving an output of the amplifier, and a plurality of outputs 97 connected to back gates of respective transistors 72.1 to 72.n in the output stages. The correction circuit 94 may comprise memory and one or more digital to analog converters for controlling the back gate voltage of several of the transistors. This enables the response of a transistor 72.1 to 72.n to be modified to vary the current that it passes for a given gate to source voltage. Such response trimming may be provided by a relatively small DAC associated with each transistor that has been selected for trimming. The correction circuit 94 may provide a fixed back gate voltage for each transistor whose response is being trimmed, or the controller may be responsive to the control voltage provided at the output of the amplifier 22, and may be arranged to add a correction factor to it. Where the output voltage of the amplifier 22 is not expected to vary by much, then these approaches are more or less equivalent. The transistors passing the most current are the ones for which driven mismatch has the most impact, so the trimming, if provided, should be preferentially applied to the transistors passing relatively large current.

Figure 9:
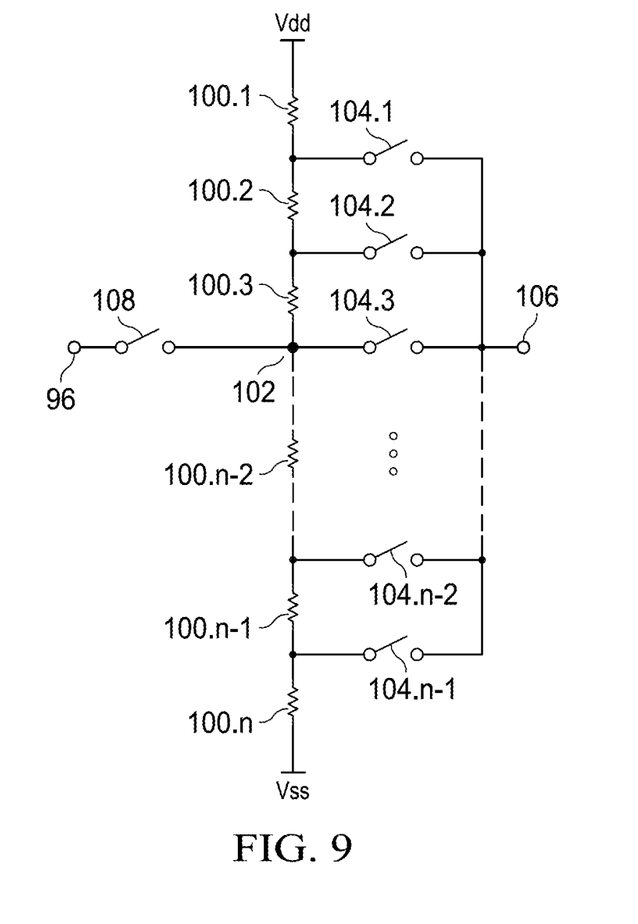
FIG. 9 schematically shows an example embodiment of a DAC for modifying a back gate voltage of a FET.

FIG. 9 shows a simple resistor DAC that may be implemented within the correction circuit 94 to provide a modified back gate voltage to one of the transistors 72.1 to 72.n.

The DAC comprises a string of resistors 100.1 to 100.n arranged in series between Vdd and Vss or other suitable voltage supplies. The resistors need not be equal valued. For example if the output voltage from the amplifier 22 is expected to span over a narrow range, for example because it is driven from a constant Vin or a narrow range of Vin, then the values of the resistors 100.1 to 100.n can be selected so as to set a voltage at a mid-point node 102 of the string of resistors to a value which sits within, and is preferably close to, the required target range of voltages for supply to the back gates, which may be similar to the expected amplifier output voltage. Switches 104.1 to 104.n-1 are provided to selectively tap the resistor string to provide a voltage to an output node 106. The first switch 104.1 taps off the voltage at a node formed between the first resistor 100.1 and the second resistor 100.2. The second switch taps the voltage between the second and third resistors 100.2 and 100.3, and so on. It can be seen that by suitable selection of the switches, a desired voltage can be supplied to the back gate of a transistor connected to the node 106.

In a variation, the midpoint node 102 may be connected to the output of the amplifier 22, either permanently of by way of a switch 108. This causes the voltage at the output node 106 to track the amplifier output voltage, subject to an offset provided by the potential divider formed by the resistor string. Individual DACs may be provided to drive the back gate of each transistor, or a DAC may be shared in a time-multiplexed manner between a plurality of transistors. The output of the DAC may be used to charge a real or a parasitic capacitor associated with the back gate of the transistor. One resistor string may be shared concurrently by several networks of switches to provide multiple output voltages.

Figure 10:
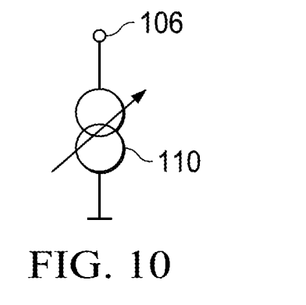
FIG. 10 shows an example embodiment of a current mode circuit for modifying a back gate voltage of a FET.

Instead of directly providing a bias voltage, the controller may include several current sources or current sinks 110, an example of which is shown in FIG. 10, each connected to a respective back gate to force a current to flow at a connection to the back gate. This approach utilizes the existence of a parasitic diode within the FET's to convert a small current from the convertor into a back gate voltage.

The midpoint node may represent the middle of the target range, and may be used as a nominal or reset value. Values for controlling the DACs or current sources may be programmed into the controller 94 during a calibration process, or may be located from memory or power up. It is this possible to provide a transconductance circuit which is suitable for use within a current digital to analog converter, and similarly it is possible to provide a digital to analog converter having an improved performance.

In general, current mode signals are robust to common-mode variations unlike single ended voltage signals that are inherently referenced to a ground, or other, voltage potentials. It is therefore advantageous to use current output to drive load or sensor circuitry that may (or may not) be integrated on a same integrated circuit (IC) device. The transconductive DAC described herein serves to take advantage of the relative ease of generating voltage signals and the advantages of current mode outputs, providing a current output signal using a voltage input reference. Voltage references (e.g., bandgap voltage references, sub-bandgap voltage references, and Zener voltage) are commonplace and generally preferred in certain scenarios. This voltage input level may be a static reference level, or it can also be varied (e.g., using a DAC), and this can be used to optimize transconductance performance. The input voltage, and resultant compliance voltage, may be varied independent of the output current level for the specific load and application.

The current output from the transconductance DAC is substantially common-mode voltage insensitive, which can be useful in any number of precision applications. It is desirable to use voltage reference input. In addition, transconductance can provide for both voltage input and current output, combining two desirable attributes. Such an architecture can enable an independent control of the output compliance and the current level. The voltage input may be a stable, current independent voltage (e.g., using a voltage reference). The voltage input can be modified with the proposed configuration. Alternatively, the voltage across the impedance can be modified (e.g., increased in low current configurations versus higher current configurations) to reduce the sensitivity to error sources if/as the output compliance allows.

This precision transconductance technology can be applied, for example, in healthcare through optical vital sign measurements. Optical vital sign measurement is important because it allows measurement of vital signs of a patient in a non-invasive fashion. Some of the vital signs that can be measured include blood oxygen saturation (SpO2) and heart rate. The vital signs are measured by illuminating the surface and subcutaneous area of the skin with a light source and then measuring the optical signal, as it is reflected back and modulated by the tissue and blood flow. In order to have precise and accurate vital sign measurements, it is important to be able to provide a low noise way to produce the light to measure the vital signs. Past efforts have failed to provide a low power solution that provides sufficient photometry, colorimetry, and spectrometry in optical vital sign measurement. Photometry is a measurement of the brightness of light perceived by the human eye. Colorimetry is a measurement of human color perception of light. Spectrometry is a measurement of the wavelength of light. This precision transconductance device can allow a precision transconductance digital to analog converter to be designed and placed into a module of an optical vital sign measurement device that can be used to precisely control a light emitting source that directs the light through some part of the body, and it is received in turn by an optical detector. The optical guide can be constructed from any material capable of directing light including, for example, polycarbonate, water clear polycarbonate, plastics, glass, etc. By being able to precisely control the light source with the precision transconductance device, the wavelengths of the light transmitted in the tube are more precisely transmitted allowing for accurate readings of vital signs while consuming less power. Optical vital signs measurements can be made at many body sites, with a wide range of optical attenuation between the emitter and detector. It is common practice to adjust the intensity at the emitter in order to maintain an approximately constant signal at the detector. The present disclosure is adapted to maximize the SNR when the excitation current is small, while not necessarily needing a large input voltage when the designated current is large.

The precision transconductance device can also provide benefits in industrial applications such as industrial processes control, field transmitters, and 4 mA-20 milliamp (mA) systems. The analog 4 mA-20 mA and 10 mA-50 mA current loops are commonly used for industrial process control systems, with 4 mA representing the lowest end of the range and 20 mA the highest. The advantages of these analog current loops are that the accuracy of the signal may not be affected by voltage drop in the interconnecting wiring, and that the loop can supply operating power to the device. Hence, current output is desirable, where there is widespread usage of 4 mA-20 mA architectures, for example. Even if there is significant electrical resistance in the line, the current loop transmitter can maintain the proper current, up to its maximum voltage capability. The live-zero represented by 4 mA allows the receiving instrument to detect some failures of the loop, and also allows transmitter devices to be powered by the same current loop (referred to as two-wire transmitters). Such instruments could be used to measure pressure, temperature, flow rates, pH or other process variables in industrial systems, for example. The precision transconductance device can also be used to control industrial systems such as a valve positioner or other output actuator, along with any number of additional industrial applications.

The precision transconductance device can provide benefits in consumer applications such as audio and video applications. For example, many mobile devices send analog audio signals to earphones. The precision transconductance device can be used to provide a better audio signal to the earphones. The mobile device could be a cell phone, a smart phone, a digital music player, a tablet, a laptop computer, or any other handheld device. The precision transconductance can be used in other audio applications to drive any type of speaker including loudspeakers and stereo speakers. The advantage of the precision transconductance device is that the speakers can be driven over a wide range and over longer wires than possible with other solutions. The same is true for video applications such as sending an analog signal to a display device, along with any number of additional audio/video applications.

The claims presented here are written in single dependency format suitable for use at the Patent office of the United States of America. However, for the avoidance of doubt, each claim may depend on any preceding claim of the same category except when that is clearly technically infeasible.

In the discussions of the embodiments above, the controllers, back gates, transistors, capacitors, arrays, switches, inductors, resistors (of any type), amplifiers, nodes, converters, digital core, and/or other components can readily be replaced, substituted, or otherwise modified in order to accommodate particular circuitry needs. Moreover, it should be noted that the use of complementary electronic chips, hardware, software, etc. offer an equally viable option for implementing the teachings of the present disclosure.

In one example embodiment, any number of electrical circuits of the FIGURES may be implemented on a board of an associated electronic chip. The board can be a general circuit board that can hold various components of the internal electronic system of the electronic chip and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and other peripheral chips may be attached to the board as plug-in cards, via cables, or integrated into the board itself.

In another example embodiment, the electrical circuits of the FIGURES may be implemented as stand-alone modules (e.g., a chip with associated components and circuitry configured to perform a specific application or function) or implemented as plug-in modules into application specific hardware of electronic chips. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities as described herein may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of components, logic operations, equations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that rely on synchronization signals to execute specialized software programs, or algorithms, some of which may be associated with processing digitized real-time data. Certain embodiments can relate to multi-DSP signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can apply the functionalities described herein in high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the electrical circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media chip). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes, Examples, and Implementations

Note that all optional features of the apparatus described above may also be implemented with respect to the method or process described herein and specifics in the examples may be used anywhere in one or more embodiments. In a first example, a system is provided (that can include any suitable circuitry, dividers, capacitors, resistors, inductors, DACs, ADCs, arrays, logic gates, software, hardware, links, etc.) that can be part of any type of electronic device (e.g., computer), which can further include a circuit board coupled to a plurality of electronic components.

The system can include means for trimming currents between a plurality of current control stages, where first and second stages each comprise a respective field effect transistor, said field effect transistors having top gates and back gates, wherein the top gates are connected to a shared node so as to receive a shared control voltage, and the back gates are driven to respective voltages so as to set a current ratio between the first and second stages to a desired value.

In other embodiments, a voltage applied to the back gate can be provided by a DAC. Additionally, the stages can be provided as part of a transconductance DAC. The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

The invention claimed is:

1. A transconductance circuit, comprising:
   an output node;
   at least one transistor;
   a variable resistance;
   a controller to adjust the variable resistance in response to an input word; and
   a differential amplifier, wherein the at least one transistor and the variable resistance are in series connection with the output node, an output of the differential amplifier is connected to a control node of the at least one transistor, a first input of the amplifier is responsive to an input signal, and a second input of the amplifier is responsive to a voltage across the variable resistance.

2. The transconductance circuit as claimed in claim 1, wherein the variable resistance comprises a plurality of resistors.

3. The transconductance circuit as claimed in claim 2, wherein individual resistors of the plurality of resistors are controllably connectable between a first resistor node and a second resistor node.

4. The transconductance circuit as claimed in claim 3, wherein the first resistor node is an input to the differential amplifier.

5. The transconductance circuit as claimed in claim 3, wherein one or more of the resistors are in series connection with respective transistors.

6. The transconductance circuit as claimed in claim 5, wherein where a plurality of transistors are provided, at least some of the transistors are associated with respective control switches between a control terminal of the transistor and the amplifier output.

7. The transconductance circuit as claimed in claim 6, wherein respective feedback switches are provided in a signal path between the second input of the amplifier and the first resistor node.

8. The transconductance circuit as claimed in claim 7, wherein the feedback switches have an on resistance that substantially scales as a function of the current passed by a respective output transistor.

9. The transconductance circuit as claimed in claim 1, wherein the transconductance circuit comprises a plurality of output transistors, and further including a correction circuit coupled to a back gate of at least one output transistor and arranged to modify a back gate voltage at the at least one output transistor.

10. The transconductance circuit as claimed in claim 9, wherein the correction circuit is arranged to modify the back gate voltages of individual transistors, such that different output transistors within the transconductance circuit have different back gate voltages.

11. The transconductance circuit as claimed in claim 10, wherein back gate voltages are modified by:
   a) applying a voltage to the back gate; or
   b) forcing a current to flow at a connection to a back gate.

12. The transconductance circuit as claimed in claim 1, further comprising an analog to digital converter that includes the transconductance circuit.

13. The transconductance circuit as claimed in claim 12, further comprising:
   a first plurality of transistors arranged to form a first thermometer encoded stage, each of the transistors operable to pass a first current; and a second plurality of transistors forming a second stage, where at least some of the transistors of the second stage pass a current that differs from the first current.

14. The transconductance circuit as claimed in claim 12, further comprising:
   a controller to vary the input voltage to the differential amplifier in response to the input word or a further input word.

15. An integrated circuit in which an electrically controllable resistance is provided with a feedback loop of a digital code to current convertor, wherein voltage at a node of the electrically controllable resistance is controlled by varying current passed by a transistor connected in series with the electrically controllable resistance in response to a digital code.

16. The integrated circuit as claimed in claim 15, wherein a voltage across the electrically controllable resistance is compared with an input voltage by a comparison device, and a voltage at a node of the electrically controllable resistance is modified as a result of the comparison to obtain a desired current flow through the electrically controllable resistance.

17. The integrated circuit as claimed in claim 16, wherein the electrically controllable resistance comprises a plurality of impedances which are selectively connectable to a comparison input of a component adapted to compare a voltage across the electrically controllable resistance with an input voltage.

18. An integrated circuit, comprising:
a plurality of current control stages, wherein at least some of the stages comprise a field effect transistor arranged to pass a current in response to a shared voltage provided to gates of the field effect transistors, and wherein a plurality of the transistors have back gates which are connected to a circuit that is adapted to supply respective voltages or currents to the back gates of the transistors such that different transistors have different back gate voltages;
wherein the stages further comprise impedances connected in series with the transistor of each stage, and when a stage is selected to pass a current, a voltage across the impedance of that stage is used as a measure of a current being passed by that stage.

19. The integrated circuit as claimed in claim 18, wherein the impedances for stages selected to pass a current are connected in parallel between first and second nodes, and the voltage difference between the nodes is provided as an input to an amplifier.

20. The integrated circuit as claimed in claim 19, wherein the input voltage is referenced with respect to one of the first and second nodes, such that the voltage at the other one of the first and second nodes is an input to the amplifier.

21. A method, comprising:
trimming currents between a plurality of current control stages, wherein first and second stages each comprise a respective field effect transistor, in series with a variable resistance, said field effect transistors having top gates and back gates, wherein the top gates are connected to a shared node so as to receive a shared control voltage, and the back gates are driven to respective voltages based on an digital word so as to set a current ratio between the first and second stages to a desired value.

22. The method as claimed in claim 21, wherein a voltage applied to the back gate is provided by a DAC.

23. The method as claimed in claim 21, wherein the stages are provided as part of a transconductance DAC.

24. The method as claimed in claim 21, further comprising varying resistance of the variable resistance to reduce influence of non-ideal artifacts from a differential amplifier.

25. The transconductance circuit of claim 1, wherein the controller increases the variable resistance when a designated current is relatively small and decreases the variable resistance when the designated current is relatively large to allow for output of relatively low noise current signals in response to relatively small designated currents and/or provide improved precision when dealing with small voltage signals at the first input of the differential amplifier.

26. The transconductance circuit of claim 1, wherein the output node of the transconductance circuit controls a light emitting source for making optical vital sign measurements.

27. The transconductance circuit of claim 26, wherein the optical vital sign measurements comprises one or more of the following: blood oxygen saturation measurements and heart rate measurements.

28. The transconductance circuit of claim 1, wherein the output node controls a light emitting source for one or more of the following: photometry, colorimetry, and spectrometry.

29. The transconductance circuit of claim 1, wherein the output node supplies current to one or more devices used to perform one or more of the following: industrial process control, measure pressure, measure temperature, measure flow rates, measure pH, control valve position, and control output actuation.

30. The transconductance circuit of claim 1, wherein the output node provides current for one or more of the following: a 4 milliamps to 20 milliamps current loop and a 10 milliamps to 50 milliamps current loop.

31. The transconductance circuit of claim 1, wherein the output node drives one or more of the following: earphones, loud speaker, stereo speaker, and display device.

32. A transconductance circuit, comprising:
an output node;
one or more transistors;
a variable resistance comprising a plurality of resistors; and
a differential amplifier;
wherein:
the at least one transistor and the variable resistance are in series connection with the output node;
an output of the differential amplifier is connected to a control node of the at least one transistor;
a first input of the amplifier is responsive to an input signal;
a second input of the amplifier is responsive to a voltage across the variable resistance; and
individual resistors of the plurality of resistors are controllably connectable between a first resistor node and a second resistor node.

33. The transconductance circuit of claim 32, wherein:
the individual resistors are in series connection with respective transistors; and
at least some of the at least one transistors are associated with respective control switches between a control terminal of the transistor and the differential amplifier output.

* * * * *